United States Patent
Heyne et al.

(10) Patent No.: US 6,198,328 B1
(45) Date of Patent: Mar. 6, 2001

(54) CIRCUIT CONFIGURATION FOR PRODUCING COMPLEMENTARY SIGNALS

(75) Inventors: Patrick Heyne; Thoralf Grätz; Dieter Härle; Bret Johnson, all of München (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/311,120

(22) Filed: May 13, 1999

(30) Foreign Application Priority Data

May 13, 1998 (DE) .............................. 198 21 458

(51) Int. Cl.[7] .............................. G06F 1/04; H03K 8/017
(52) U.S. Cl. .............................. 327/295; 327/292
(58) Field of Search .................... 327/291–295, 327/99, 171, 161, 165, 211, 212, 256, 259, 407; 326/96

(56) References Cited

U.S. PATENT DOCUMENTS

| | | | |
|---|---|---|---|
| 4,617,477 | 10/1986 | DePaolis, Jr. | 207/443 |
| 5,140,174 | 8/1992 | Meier et al. | 307/269 |
| 5,341,048 | * 8/1994 | Randhawa et al. | 327/295 |
| 5,736,882 | * 4/1998 | Witte | 327/259 |
| 5,751,176 | * 5/1998 | Sohn et al. | 327/295 |
| 5,852,378 | * 12/1998 | Keeth | 327/171 |
| 5,867,043 | * 2/1999 | Kim | 327/257 |
| 5,867,046 | * 2/1999 | Sugasawa | 327/258 |

FOREIGN PATENT DOCUMENTS

| | | |
|---|---|---|
| 37 11 604 A1 | 10/1987 | (DE). |
| 196 24 270 A1 | 7/1997 | (DE). |
| 0 310 232 A2 | 4/1989 | (EP). |

OTHER PUBLICATIONS

Patent Abstracts of Japan No. 08051347 A (Yoshiyuki), dated Feb. 20, 1996, Phase matching circuit.

* cited by examiner

*Primary Examiner*—My-Trang Nu Ton
(74) *Attorney, Agent, or Firm*—Herbert L. Lerner; Laurence A. Greenberg; Werner H. Stemer

(57) ABSTRACT

The circuit configuration produces complementary signals. An input signal is routed from an input terminal via a first path, through a pass element, and to a first output terminal. The input signal is also routed on a second path, connected in parallel with the first path, via an inverter, and to a second output terminal. The first and the second output terminal are connected to a first and a second output node, respectively, via a compensation device. The compensation device compensates for the different time delays in the signals on the first and on the second path.

3 Claims, 1 Drawing Sheet

PRIOR ART

CIRCUIT CONFIGURATION FOR PRODUCING COMPLEMENTARY SIGNALS

BACKGROUND OF THE INVENTION

Field of the Invention

The lies in the electronics field. Specifically, the present invention relates to a circuit configuration for producing complementary signals, in which an input signal that is present at an input terminal is routed on a first path to a first output terminal via a pass element and on a second path, connected in parallel with the first path, to a second output terminal via an inverter.

In this context, a pass element should be understood as meaning an element with an input and an output, such as, in particular, a transfer gate or else a switch. By way of example, such a pass element can comprise a parallel circuit made up of an n-channel MOS transistor and a p-channel MOS transistor whose sources and drains are connected to one another in each case and whose gates are driven by mutually inverted signals, so that the pass element is either on or off depending on the control signal.

An existing circuit configuration of the type mentioned in the introduction thus has a pass element in the first path and an inverter in the second path, connected in parallel with the latter, so that the pass element and the inverter are used to obtain mutually complementary signals from one input signal.

Such a circuit configuration is quite simple in its layout since it requires only one inverter and one pass element to provide the complementary output signals. For time-critical applications, however, the existing circuit configuration has a significant disadvantage: the delays which the signals experience through the pass element and the inverter differ from one another to a significant extent as a result of the process. The time difference, resulting from the process window, between the mutually complementary signals cannot be eliminated in practice, which is extremely undesirable for the time-critical applications mentioned, such as in a DLL (delayed locked loop). This means that the existing circuit configurations comprising an inverter and a pass element cannot be used satisfactorily for high-precision applications.

Referring now to FIG. 2 of the drawing, there is shown a prior art circuit configuration with an inverter 1 and a pass element 2 comprising a p-channel MOS transistor 3 and an n-channel MOS transistor 4. The transistors 3 and 4 are interconnected by their source and drain in each case and are thus connected in parallel with one another. The gates of the transistors 3, 4 have the fixed potentials of the supply voltages VSS and VDD, respectively, applied to them.

An input signal IN is received at an input terminal 5. The signal travels via an inverter 1 to a first output terminal 6 and to a second output terminal 7 via the pass element 2. On account of the various delays, resulting from the process window, caused by the inverter 1 and the pass element 2, respectively, signals C1 and C2, respectively, at the output terminals 6 and 7 are therefore not in sync, but have a considerable time difference in respect of one another. The time difference is extremely disadvantageous for time-critical applications such as a DLL.

SUMMARY OF THE INVENTION

It is accordingly an object of the invention to provide a circuit configuration for producing complementary signals, which overcomes the above-mentioned disadvantages of the heretofore-known devices and methods of this general type and which provides for complementary signals that are as concurrent with one another as possible over the process window.

With the foregoing and other objects in view there is provided, in accordance with the invention, a circuit configuration for producing complementary signals, comprising:

an input terminal receiving an input signal;
a first output terminal connected to the input terminal via a first path carrying the signal;
a pass element connected in the first path between the input terminal and the first output terminal;
a second output terminal connected to the input terminal via a second path connected in parallel with the first path;
an inverter connected in the second path between the input terminal and the second output terminal for inverting the input signal;
a compensation device connected to the first and second output terminals and having a first output node and a second output node, the compensation device compensating for mutually different time delays in the signals on the first path and the second path.

In other words, the objects of the invention are satisfied in that the first and second output terminals are connected to a first and a second output node, respectively, via a compensation device, and in that the compensation device compensates for the different time delays in the signals on the first and on the second path.

The invention thus adopts a completely different approach from the state of the art. Instead of making efforts to bring the time delays caused by the inverter and the pass element more into line with one another, the inertia of the compensation device is exploited in order to compensate for the different time delays in the two paths, so that, eventually, the delays in an input signal at the two output nodes are more concurrent with one another over the process window.

In accordance with an added feature of the invention, the compensation device comprises a plurality of further pass elements.

In accordance with an additional feature of the invention, each pass element comprises an n-channel MOS transistor and a p-channel MOS transistor connected in parallel with the n-channel MOS transistor.

In accordance with another feature of the invention, the further pass elements include a first further pass element with a first n-channel MOS transistor and a first p-channel MOS transistor connected in parallel with the first n-channel MOS transistor, a second further pass element with a second n-channel MOS transistor and a second p-channel MOS transistor connected in parallel with the third n-channel MOS transistor, a third further pass element with a third n-channel MOS transistor and a third p-channel MOS transistor connected in parallel with the third n-channel MOS transistor, and a fourth further pass element with a fourth n-channel MOS transistor and a fourth p-channel MOS transistor connected in parallel with the fourth n-channel MOS transistor; each of the MOS transistors having a gate; and the first output terminal is connected to the gate of the first p-channel MOS transistor, the gate of the second n-channel MOS transistor, the gate of the third p-channel MOS transistor, and the gate of the fourth n-channel MOS transistor;

the second output terminal is connected to the gate of the first n-channel MOS transistor, the gate of the second p-channel MOS transistor, the gate of the third n-channel MOS transistor, and the gate of the fourth p-channel MOS transistor;

the first and second further pass elements have a common output connected to the first output node, and the third and fourth further pass elements have a common output connected to the second output node.

In accordance with a concomitant feature of the invention, the first further pass element and the fourth further pass element each have an input connected to a first supply voltage, and the second further pass element and the third further pass element each have an input connected to a second supply voltage.

The invention thus uses pass elements and transfer gates, whose inputs are connected to the first and the second supply voltage, respectively, and hence are at a fixed potential, in order to generate at the two output nodes complementary signals whose time delays have been compensated for. Although the four further pass elements increase the circuit complexity in comparison with the existing circuit configuration, the complexity is acceptable when, in the case of a DLL for example, time-critical applications are involved, which require the complementary signals to have a high level of precision in relation to time.

Other features which are considered as characteristic for the invention are set forth in the appended claims.

Although the invention is illustrated and described herein as embodied in a circuit configuration for producing complementary signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Mutually identical and functionally equivalent components are identically identified in the two drawing figures.

DESCRIPTION OF THE PREFERRED EMBODIMENTS

Figure 1:
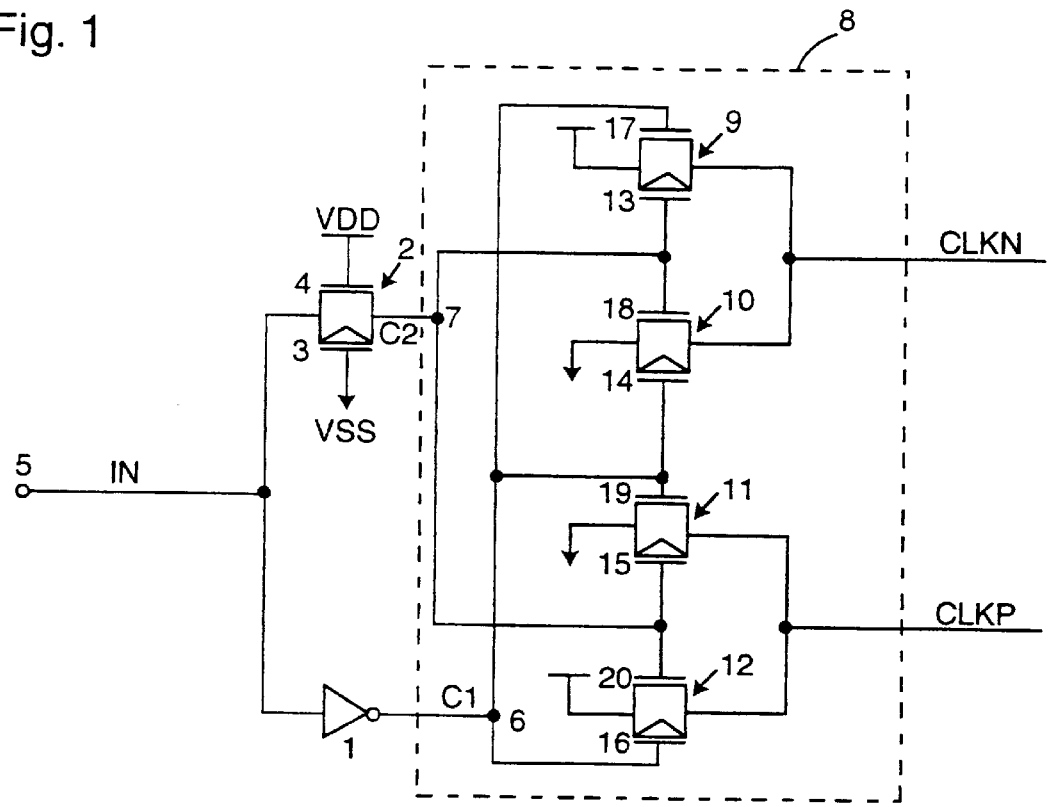
FIG. 1 is a circuit schematic of an exemplary embodiment of the circuit configuration according to the invention.
Figure 2:
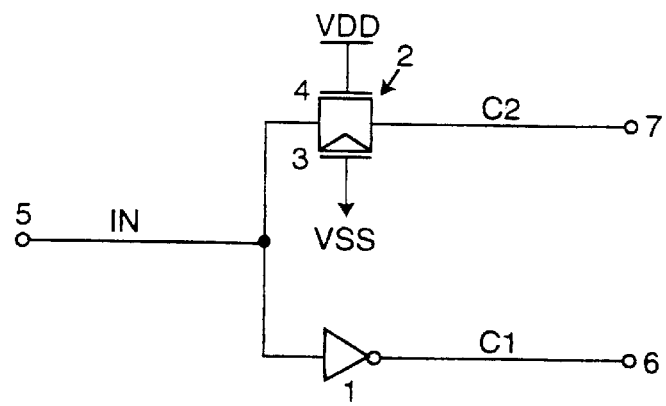
FIG. 2 is a circuit schematic of a prior art circuit configuration.

Referring now to the figure of the drawing that details the inventive circuit, namely FIG. 1, there is seen a compensation device 8 provided for the output terminals 6, 7. The compensation device 8 compensates for the time delays between the signals C1 and C2, so that the delays in the input signal IN are more concurrent at output nodes CLKN and CLKP.

Specifically, the compensation device 8 comprises further pass elements 9, 10, 11, 12 which each have p-channel MOS transistors 13, 14, 15 and 16 and n-channel MOS transistors 17, 18, 19 and 20. The output terminals of the pass elements 9, 10 are connected to the output node CLKN, and the output terminals of the pass elements 11, 12 are connected to the output node CLKP. The input terminals of the pass elements 9, 12 are connected to the supply voltage VDD, and the input terminals of the pass elements 10, 11 are connected to the supply voltage VSS.

If, for example, the output terminal 6 is at "0," then the p-channel MOS transistors 14 and 16 are on, while the n-channel MOS transistors 17 and 19 are off. In this case, the output signal C2 is "high," so that the p-channel MOS transistors 15 and 13 are off, while the n-channel MOS transistors 18 and 20 are on. This means that the pass elements 10 and 12 are on, while the pass elements 9 and 11 are off. If the polarity of the output terminals 6 and 7 is reversed, that is to say if the output signal C1 is "high" and the output signal C2 is "low," the pass elements 9, 11 are on, while the pass elements 10, 12 are off.

Hence, in each case, after passing through the inverter 1 and the pass element 2, respectively, the input signal IN is routed through the compensation device 8, whose inertia compensates for the time delays between the output signals C1 and C2 from the inverter 1 and the pass element 2, respectively, so that signals whose delays are more concurrent are obtained at the output nodes CLKP and CLKN.

We claim:

1. A circuit configuration for producing complementary signals, comprising:

an input terminal receiving an input signal;

a first output terminal connected to said input terminal via a first path carrying the signal;

a pass element connected in said first path between said input terminal and said first output terminal;

a second output terminal connected to said input terminal via a second path connected in parallel with said first path;

an inverter connected in said second path between said input terminal and said second output terminal for inverting the input signal, and in parallel to the pass element;

a compensation device connected to said first and second output terminals and having a first output node and a second output node, said compensation device compensating for mutually different time delays in the signals on said first path and said second path;

said compensation device including a plurality of further pass elements each having an n-channel MOS transistor and a p-channel MOS transistor connected in parallel with said n-channel MOS transistor.

2. The circuit configuration according to claim 1, wherein said further pass elements include a first further pass element with a first n-channel MOS transistor and a first p-channel MOS transistor connected in parallel with said first n-channel MOS transistor, a second further pass element with a second n-channel MOS transistor and a second p-channel MOS transistor connected in parallel with said second n-channel MOS transistor, a third further pass element with a third n-channel MOS transistor and a third p-channel MOS transistor connected in parallel with said third n-channel MOS transistor, and a fourth further pass element with a fourth n-channel MOS transistor and a fourth p-channel MOS transistor connected in parallel with said fourth n-channel MOS transistor; each of said MOS transistors having a gate; and wherein said first output terminal is connected to said gate of said first p-channel MOS transistor, said gate of said second n-channel MOS transistor, said gate of said third p-channel MOS transistor, and said gate of said fourth n-channel MOS transistor;

said second output terminal is connected to said gate of said first n-channel MOS transistor, said gate of said second p-channel MOS transistor, said gate of said third n-channel MOS transistor, and said gate of said fourth p-channel MOS transistor;

said first and second further pass elements have a common output connected to said first output node, and said third and fourth further pass elements have a common output connected to said second output node.

3. The circuit configuration according to claim 2, wherein said first further pass element and said fourth further pass element each have an input connected to a first supply voltage, and said second further pass element and said third further pass element each have an input connected to a second supply voltage.

* * * * *